(12) United States Patent
Shieh et al.

(10) Patent No.: US 7,812,346 B2
(45) Date of Patent: Oct. 12, 2010

(54) METAL OXIDE TFT WITH IMPROVED CARRIER MOBILITY

(75) Inventors: Chan-Long Shieh, Paradise Valley, AZ (US); Gang Yu, Santa Barbara, CA (US)

(73) Assignee: Cbrite, Inc., Goleta, CA (US)

( * ) Notice: Subject to any disclaimer, the term of this patent is extended or adjusted under 35 U.S.C. 154(b) by 294 days.

(21) Appl. No.: 12/173,995

(22) Filed: Jul. 16, 2008

(65) Prior Publication Data

US 2010/0012932 A1    Jan. 21, 2010

(51) Int. Cl.
*H01L 29/10* (2006.01)

(52) U.S. Cl. .......... 257/43; 257/E49.002; 257/E29.296; 257/E49.003; 257/E21.495; 438/104

(58) Field of Classification Search ............. 257/43, 257/E49.002, E29.296, E49.003, E21.495; 438/104

See application file for complete search history.

(56) References Cited

U.S. PATENT DOCUMENTS 7,271,458 B2 *  9/2007  Chui et al. ................. 257/410
2004/0222448 A1  11/2004  Takao
2007/0231599 A1  10/2007  Nakamura et al.
2008/0105870 A1   5/2008  Yu et al.

* cited by examiner

*Primary Examiner*—Tu-Tu V Ho
(74) *Attorney, Agent, or Firm*—Parsons & Goltry; Robert A. Parsons; Michael W. Goltry

(57) ABSTRACT

A fabrication method is used in conjunction with a semiconductor device having a metal oxide active layer less than 100 nm thick and the upper major surface and the lower major surface have material in abutting engagement to form underlying interfaces and overlying interfaces. The method of fabrication includes controlling interfacial interactions in the underlying interfaces and the overlying interfaces to adjust the carrier density in the adjacent metal oxide by selecting a metal oxide for the metal oxide active layer and by selecting a specific material for the material in abutting engagement. The method also includes one or both steps of controlling interactions in underlying interfaces by surface treatment of an underlying material forming a component of the underlying interface and controlling interactions in overlying interfaces by surface treatment of the metal oxide film performed prior to deposition of material on the metal oxide layer.

21 Claims, 2 Drawing Sheets

METAL OXIDE TFT WITH IMPROVED CARRIER MOBILITY

FIELD OF THE INVENTION

This invention generally relates to metal oxide semiconductor films in TFTs and more specifically to the carrier density of the metal oxide film.

BACKGROUND OF THE INVENTION

There is a strong interest in metal oxide semiconductor because of its high carrier mobility, light transparency and low deposition temperature. The high carrier mobility expands applications to higher performance domains that require higher frequency or higher current. The light transparency eliminates the need for a light shield in display and sensor active matrices. The low deposition temperature enables application to flexible electronics on plastic substrates.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. In order to achieve high mobility for high performance applications, the volume carrier density of the metal oxide channel should be high and thickness of the metal oxide film should be small (e.g. <100 nm and preferably <50 nm).

Traditionally, the volume carrier concentration in metal oxide is controlled by oxygen vacancies. The oxygen vacancies can be controlled by: (a) partial pressure of oxygen during the deposition; (b) high temperature treatment; and (c) valence doping. But when the channel thickness becomes very small, the bulk carrier control is no longer sufficient and effective.

It would be highly advantageous, therefore, to remedy the foregoing and other deficiencies inherent in the prior art.

Accordingly, it is an object of the present invention to provide a new and improved method of fabricating a metal oxide semiconductor device with carrier concentrations in semiconductor material adjacent selected interfaces adjusted to a desired density.

It is another object of the present invention to provide a new and improved method of controlling interfacial interactions in a metal oxide semiconductor device to adjust the carrier density in the adjacent metal oxide.

It is another object of the present invention to provide a new and improved metal oxide semiconductor device in which carrier density of the metal oxide channel is high and the thickness of the metal oxide film is small.

SUMMARY OF THE INVENTION

Briefly, to achieve the desired objects of the instant invention in accordance with a preferred embodiment thereof, provided is a method used in conjunction with the fabrication of a semiconductor device having a metal oxide active layer less than 100 nm thick and the upper major surface and the lower major surface have material in abutting engagement to form underlying interfaces and overlying interfaces. The method of fabrication includes controlling interfacial interactions in the underlying interfaces and the overlying interfaces by selecting a metal oxide for the metal oxide active layer and by selecting a specific material for the material in abutting engagement. The method also includes one or both steps of controlling interactions in underlying interfaces by surface treatment of an underlying material forming a component of the underlying interface and controlling interactions in overlying interfaces by surface treatment of the metal oxide film performed prior to deposition of material on the metal oxide layer. The terms "controlling interfacial interactions" and "interfacial interactions", as used in this disclosure, are defined as actions or interactions that control or adjust the carrier density in the adjacent semiconductor material (metal oxide).

The desired objects of the instant invention are further achieved in accordance with a preferred embodiment thereof wherein a novel metal oxide semiconductor device on a flexible substrate includes a metal oxide active layer less than 100 nm thick and the upper major surface and the lower major surface have material in abutting engagement to form underlying interfaces and overlying interfaces. The novel metal oxide semiconductor device further includes one or both of a treated surface of an underlying material forming a component of the underlying interface controlling interactions in underlying interfaces and a treated surface of the metal oxide film performed prior to deposition of material on the metal oxide layer controlling interactions in overlying interfaces.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
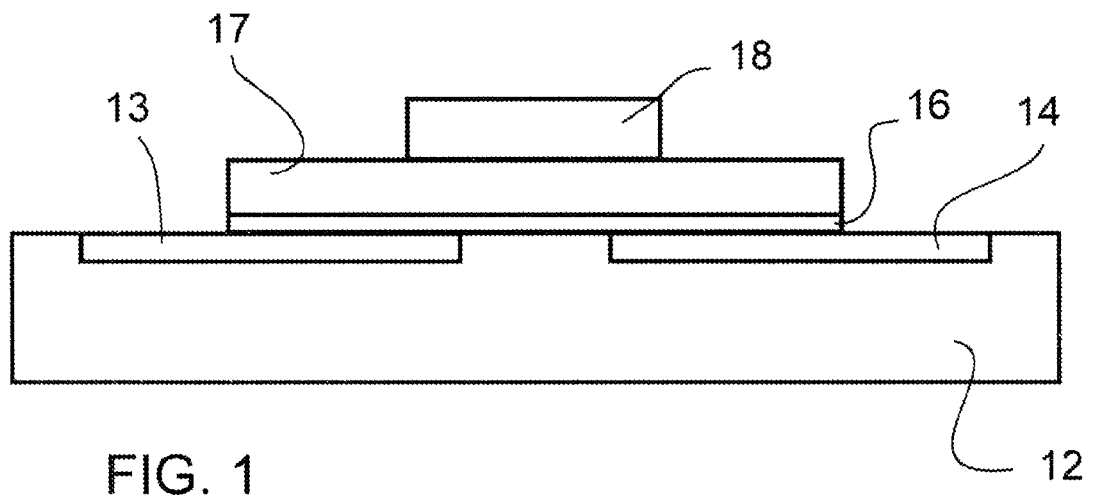
FIG. 1 is a simplified layer diagram of a TFT in accordance with the present invention with overlying gate and underlying source/drain.

The figure of merit in thin film transistors (TFTs) is defined by $\mu V/L^2$ where $\mu$ is the mobility, V is the voltage and L is the gate length. A major problem is partially remedied by the recent advance in metal oxide semiconductor materials in which mobility as high as 80 $cm^2$/V-sec has been demonstrated. One of the unique features of metal oxide semiconductors is that carrier mobility is less dependent on grain size of films, that is, high mobility amorphous metal oxide is possible. However, in order to achieve the high mobility required for high performance applications, the volume carrier density of the metal oxide channel should be high and the thickness of the metal oxide film should be small (e.g. <100 nm and preferably <50 nm). It has been found, however, that for these very thin channels, the interfacial interactions of the metal oxide with the underlying and overlaying material are no longer negligible.

The control of interfacial interactions can be implemented in either or both of two ways: (1) interaction with the underlying structure; and (2) interaction with the overlying structure. In general, the interactions are designed to react with the oxygen in the metal oxide to beneficially alter the oxygen content and, thus, the carrier density. In this regard, the term "strong interaction" is defined as an interaction that reduces the oxygen content, or increases the oxygen vacancies, in the adjacent semiconductor material and, thus, increases the carrier density. Further, in the preferred embodiment the term refers to an interaction that excessively increases the oxygen vacancies so that carriers are increased to greater than $10^{18}$ carriers per $cm^3$. This number is generally considered sufficient for making ohmic contact as, for example, at the source and drain terminals. The term "weak interaction" is defined as an interaction that increases or decreases the oxygen content, (therefore decreases or increases the oxygen vacancies), in the adjacent semiconductor material by a much smaller amount (less than $10^{18}$ carriers per $cm^3$) and, thus, controlling the carrier density (by less than $10^{18}/cm^3$).

To fabricate TFTs, any or all of the following functions for the overlying and the underlying structures may be used. For example, different functions may be used on different portions or surfaces of a TFT. As examples of uses of the different functions, weak interaction can be used to adjust the threshold of the TFT and strong interactions are preferred for the good ohmic contacts in the source/drain regions. Some possible functions of overlying structures include: (1) passivation—provides weak or no interaction; (2) Gate—provides weak or no interaction; and (3) source/drain—provide strong interaction. Also, some possible functions of underlying structures include: (1) passivation—provides weak or no interaction; (2) Gate—provides weak or no interaction; and (3) source/drain—provide strong interaction. The functions of overlying and underlying structures needed for any specific embodiment of a TFT depends on the configuration of the TFT. Multiple functions may be needed for either the overlying or the underlying structure.

In general, the type of material selected for forming the various upper and lower interfaces or providing the control of interfacial interactions with the metal oxide active layer is one way to determine the characteristics of the final device. For example, inert material is selected for less interaction while active material is selected to deplete oxygen from the metal oxide, i.e. strong interaction. Examples of inert materials are $Al_2O_3$, $SiO_2$, SiN, polyimide, BCB, photoresist, and similar materials. Examples of active materials are Al, Ti, Ta, ITO, Li. Mg, etc. Also, the specific metal oxide used in the active layer can be selected to provide specific characteristics. Examples of metal oxides that can be used include zinc oxide (ZnO), indium zinc oxide (InZnO), indium zinc gallium oxide (InZnGaO), and similar materials or combinations thereof.

In addition to or as an alternative to the selection of material used in the various underlying components, surface treatment of the underlying material at an interface can be performed right before deposition of the metal oxide film. Some typical surface treatments that can be performed include (a) ion sputtering of the underlying material to create an oxygen rich or oxygen deficient surface. Some examples of oxygen enriching treatment are treating the surface with O (oxygen ions) and some examples of oxygen reducing treatment are low energy Ar or hydrogen ions. Surface treatment (b) includes gas treatment in which either a reducing gas such as $H_2$ is used or an oxidizing gas such as $O_2$ is used. Surface treatment (c) includes liquid treatment in which the zincation process can be used to enhance the surface reactivity with metal oxide beneath the source/drain areas, an oxidizing solution such as $H_2O_2$ can be used to prepare an oxygen rich surface, or a reducing solution such as an oxygen deficient or oxygen attracting solution can be used to prepare an oxygen poor surface. In each of the above instances, the treatment is designed to produce an oxygen rich environment that can reduce the carrier concentration or a reducing environment that removes oxygen and enhances the carrier concentration in the metal oxide.

The various options or decisions pertaining to overlying structures include material selection for the overlying structures. In this selection process, examples of passive materials include $Al_2O_3$, $SiO_2$, SiN, TaO, $MgF_2$, polyimide, BCB, photoresist, and similar materials and examples of active materials include Al, Zn, Ti, Mg, Ta, ITO, etc. In addition to or as an alternative to the selection of material used, surface treatment of the metal oxide film can be performed right before deposition of any components on the metal oxide layer. Some typical surface treatments that can be performed include sputter etching, such as reducing with Ar or H or oxidizing with O or other oxidizing gases. In addition to or as an alternative to the selection of material used and/or surface treatment of the metal oxide film, the deposition method for the overlying material can have an effect. Some of the typical deposition methods that can be used include: passive methods such as evaporation, low damage sputtering, solution based processing (e.g. spin coating, dipping, printing, etc.); and active methods such as high temperature CVD, PECVD, etc. In each of the above operations, the treatment or adjacent material is designed to increase the oxygen in the metal oxide and, thus, reduce the carrier concentration or to decrease the oxygen in the metal oxide and, thus, enhance the carrier concentration in the metal oxide.

Thus, in the fabrication of a semiconductor device with a thin film metal oxide active layer, control of interfacial interactions can be implemented in either or both of two ways: (1) interaction with the underlying structure; and (2) interaction with the overlying structure. Control of interfacial interactions with surfaces underlying the metal oxide layer can be implemented by at least one of the selection of material used in the various underlying components (also the metal oxide used) and surface treatment of the underlying material. Control of interfacial interactions with surfaces overlying the metal oxide layer can be implemented by at least one of material selection for the overlying structures (also the metal oxide used), surface treatment of the metal oxide film performed right before deposition of any components on the metal oxide layer, and selection of the deposition method for the overlying material. Thus, oxygen content in the meal oxide is altered and carrier concentration is altered in accordance with a desired function, e.g. ohmic contacts, Schottky contacts, channel conduction, etc.

Turning now to FIG. 1, a simplified layer diagram of one embodiment of a TFT 10, in accordance with the present invention, is illustrated. TFT 10 includes a substrate 12, which may be a flexible material, such as plastic, or any other convenient material. In accordance with the above description of functions of underlying structures, substrate 12 is considered a passivation material and may optionally include a buffer (considered a part of substrate 22 if present) as additional or alternative passivation, if desired. A source 13 and a drain 14 are formed in or on (hereinafter generically referred to as "on") the upper surface of substrate 12 in a spaced apart orientation using any well known method. A metal oxide film 16 is formed in partial overlying relationship to both source 13 and drain 14 and the space therebetween. It will be understood that metal oxide film 16 is the active layer that conducts carriers between the source/drain components. Further, metal oxide layer 16 is less than 100 nm thick and preferably less than 50 nm. A thin gate dielectric layer 17 is formed in overlying relationship to metal oxide film 16 and a gate stack 18 is positioned on gate dielectric layer 17 in overlying relationship to the space between source 13 and drain 14. Thus, TFT 10 is a top gate, bottom source/drain type of device.

Figure 2:
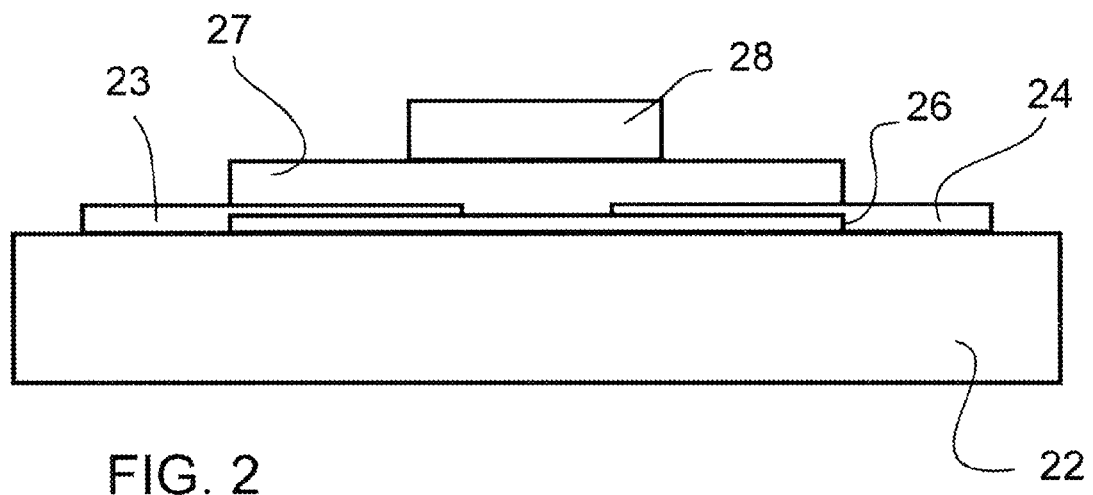
FIG. 2 is a simplified layer diagram of a TFT in accordance with the present invention with overlying gate and overlying source/drain.

Turning now to FIG. 2, a simplified layer diagram of another embodiment of a TFT 20, in accordance with the present invention, is illustrated. TFT 20 includes a substrate 22, which may be a flexible material, such as plastic, or any other convenient material. In accordance with the above description of functions of underlying structures, substrate 22 is considered a passivation material and may optionally include a buffer (considered a part of substrate 22 if present) as additional or alternative passivation, if desired. A metal oxide film 26 is deposited on substrate 22 and a source 23 and a drain 24 are formed partially in overlying relationship on the upper surface of metal oxide film 26 so as to form a spaced apart orientation on the upper surface. A thin gate dielectric layer 27 is formed in overlying relationship to metal oxide film 26 in the space between gate 23 and gate 24 and to portions of gate 23 and gate 24 adjacent to the space. A gate stack 28 is positioned on gate dielectric layer 27 in overlying relationship to the space between source 23 and drain 24. Thus, TFT 20 is a top gate, top source/drain type of device.

Figure 3:
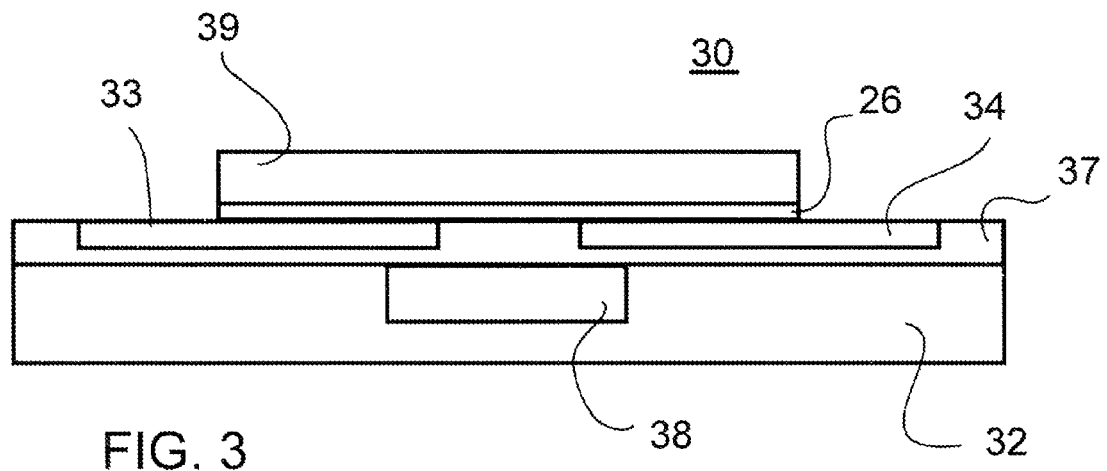
FIG. 3 is a simplified layer diagram of a TFT in accordance with the present invention with underlying gate and underlying source/drain.

Turning now to FIG. 3, a simplified layer diagram of another embodiment of a TFT 30, in accordance with the present invention, is illustrated. TFT 30 includes a substrate 32, which may be a flexible material, such as plastic, or any other convenient material. In accordance with the above description of functions of underlying structures, substrate 32 is considered a passivation material. A gate stack 38 is formed in substrate 32 by any convenient and established method. A thin gate dielectric layer 37 is formed in overlying relationship to gate stack 38 and the surrounding areas of substrate 32. A source 33 and a drain 34 are formed in or on (hereinafter generically referred to as "on") the upper surface of gate dielectric layer 37 in a spaced apart orientation using any well known method. A metal oxide film 36 is formed in partial overlying relationship to both source 33 and drain 34 and the space therebetween. A passivation layer 39 is formed over metal oxide film 36 in accordance with the present invention. Thus, TFT 30 is a bottom gate, bottom source/drain type of device.

Figure 4:
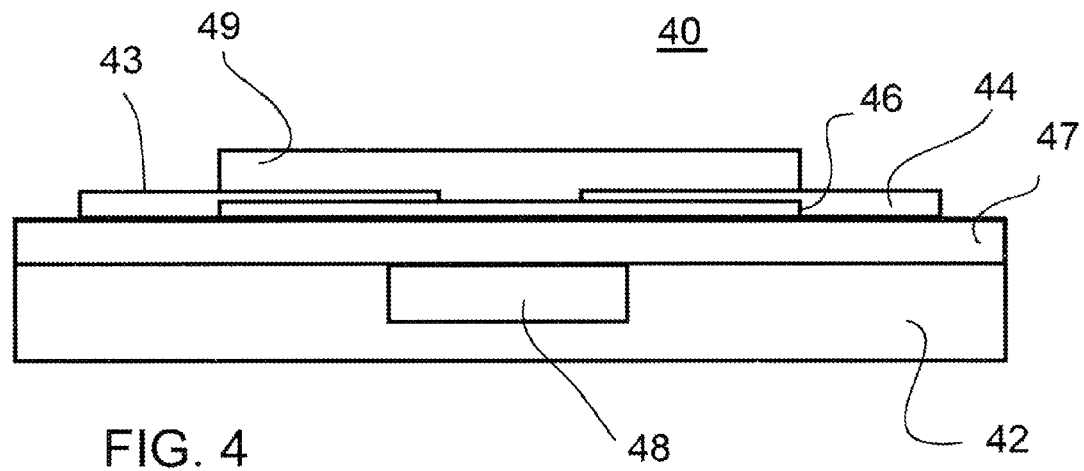
FIG. 4 is a simplified layer diagram of a TFT in accordance with the present invention with underlying gate and overlying source/drain.

Turning now to FIG. 4, a simplified layer diagram of another embodiment of a TFT 40, in accordance with the present invention, is illustrated. TFT 40 includes a substrate 42, which may be a flexible material, such as plastic, or any other convenient material. In accordance with the above description of functions of underlying structures, substrate 42 is considered a passivation material. A gate stack 48 is formed in substrate 42 by any convenient and established method. A thin gate dielectric layer 47 is formed in overlying relationship to gate stack 48 and the surrounding areas of substrate 42. A metal oxide film 46 is formed on gate dielectric layer 47 in overlying relationship to gate stack 48 and the surrounding area. A source 43 and a drain 44 are formed partially in overlying relationship on the upper surface of metal oxide film 46 so as to define a space therebetween on the upper surface overlying gate stack 48. A passivation layer 49 is formed over the exposed portion of metal oxide film 46 and the surrounding portions of source 43 and drain 44, in accordance with the present invention. Thus, TFT 40 is a bottom gate, top source/drain type of device.

The four embodiments of TFTs illustrated in FIGS. 1-4 are examples of different configurations that can be chosen. In each embodiment the semiconductor device has a metal oxide active layer less than 100 nm thick, and preferably less than 50 nm thick, with an upper major surface and a lower major surface and the upper major surface and the lower major surface have material in abutting engagement to form underlying interfaces and overlying interfaces. In each embodiment or configuration a variety of choices and procedures during fabrication can be used to control interfacial interactions in the metal oxide active layer. Generally, the method of fabrication includes controlling interfacial interactions in the underlying interfaces and the overlying interfaces by selecting a metal oxide for the metal oxide active layer and by selecting a specific material for the material in abutting engagement. Also, the method includes performing either or both functions of controlling interactions in underlying interfaces by surface treatment of an underlying material forming a component of the underlying interface and controlling interactions in overlying interfaces by surface treatment of the metal oxide film performed prior to deposition of material on the metal oxide layer.

Further, the final device constructed in accordance with the present invention is novel because the fabricated structure controls interfacial interactions to improve operation of the very thin metal oxide active layer and, therefore, the characteristics and operation of the final device. Thus, a new and improved method of fabricating a metal oxide semiconductor device with higher volume carrier concentrations is disclosed. Also, a new and improved metal oxide semiconductor device is disclosed in which carrier density of the metal oxide channel is high and the thickness of the metal oxide film is small, less than 100 nm thick, and preferably less than 50 nm thick.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. In conjunction with a semiconductor device having a metal oxide active layer less than 100 nm thick with an upper major surface and a lower major surface and the upper major surface and the lower major surface having material in abutting engagement to form underlying interfaces and overlying interfaces, a method of fabrication that includes controlling interfacial interactions to adjust the carrier density in the adjacent metal oxide comprising the steps of;

controlling interactions in the underlying interfaces and the overlying interfaces by selecting a metal oxide for the metal oxide active layer and by selecting a specific material for the material in abutting engagement; and performing one of controlling interactions in underlying interfaces by surface treatment of an underlying material forming a component of the underlying interface and controlling interactions in overlying interfaces by surface treatment of the metal oxide film performed prior to deposition of material on the metal oxide layer.

2. A method as claimed in claim 1 wherein the step of selecting a metal oxide for the metal oxide active layer includes selecting one of zinc oxide (ZnO), indium zinc oxide (InZnO), and indium zinc gallium oxide (InZnGaO).

3. A method as claimed in claim 1 wherein the step of selecting a specific material for the material in abutting engagement includes selecting one of inert material and active material.

4. A method as claimed in claim 3 wherein the step of selecting a specific material for the material in abutting engagement includes selecting an inert material from one of $Al_2O_3$, $SiO_2$, SiN, TaO, $MgF_2$, polyimide, BCB, and photoresist.

5. A method as claimed in claim 3 wherein the step of selecting a specific material for the material in abutting engagement includes selecting an active material from one of Al, Zn, Ti, Ta, ITO, Li, and Mg.

6. A method as claimed in claim 1 wherein the step of controlling interactions in underlying interfaces by surface treatment of an underlying material forming a component of the underlying interface includes one of ion sputtering of the underlying material, gas treatment using one of a reducing gas and an oxidizing gas, and liquid treatment.

7. A method as claimed in claim 1 wherein the step of controlling interactions in overlying interfaces by surface treatment of the metal oxide film includes sputter etching using one of a reducing material and an oxidizing material.

8. A method as claimed in claim 1 wherein the step of controlling interactions in overlying interfaces includes selecting a method of deposition of material on the metal oxide active layer forming a component of the overlying interface.

9. A method as claimed in claim 8 wherein the step of selecting a method of deposition of material on the metal oxide includes selecting from one of a passive method and an active method.

10. A method as claimed in claim 9 wherein the step of selecting a method of deposition of material on the metal oxide includes selecting a passive method from one of evaporation, low damage sputtering, solution based processing, spin coating, dipping, and printing.

11. A method as claimed in claim 9 wherein the step of selecting a method of deposition of material on the metal oxide includes selecting an active method from one of high temperature CVD and PECVD.

12. A method as claimed in claim 1 wherein the metal oxide layer is less than 50 nm thick.

13. In conjunction with a semiconductor device having a metal oxide active layer less than 100 nm thick with an upper major surface and a lower major surface and the upper major surface and the lower major surface having material in abutting engagement to form underlying interfaces and overlying interfaces, a method of fabrication that includes controlling interfacial interactions to adjust the carrier density in the adjacent metal oxide comprising the steps of;
controlling interactions in the underlying interfaces and the overlying interfaces by selecting a metal oxide for the metal oxide active layer and by selecting a specific material for the material in abutting engagement including one of an inert material from one of $Al_2O_3$, $SiO_2$, SiN, TaO, $MgF_2$, polyimide, BCB, and photoresist and an active material from one of Al, Zn, Ti, Ta, ITO, Li, and Mg; and
performing one of controlling interactions in underlying interfaces by surface treatment of an underlying material forming a component of the underlying interface including one of ion sputtering of the underlying material, gas treatment using one of a reducing gas and an oxidizing gas, and liquid treatment and controlling interactions in overlying interfaces by surface treatment of the metal oxide film performed prior to deposition of material on the metal oxide layer including sputter etching using one of a reducing material and an oxidizing material and selecting a method of deposition of material on the metal oxide active layer forming a component of the overlying interface.

14. A method as claimed in claim 13 wherein the step of selecting a method of deposition of material on the metal oxide includes selecting from one of a passive method and an active method.

15. A method as claimed in claim 13 wherein the step of selecting a method of deposition of material on the metal oxide includes selecting a passive method from one of evaporation, low damage sputtering, solution based processing, spin coating, dipping, and printing.

16. A method as claimed in claim 13 wherein the step of selecting a method of deposition of material on the metal oxide includes selecting an active method from one of high temperature CVD and PECVD.

17. A method as claimed in claim 13 wherein the metal oxide layer is less than 50 nm thick.

18. A metal oxide semiconductor device on a substrate comprising:
a metal oxide active layer less than 100 nm thick with an upper major surface and a lower major surface and the upper major surface and the lower major surface having material in abutting engagement to form underlying interfaces and overlying interfaces; and
one of a treated surface of an underlying material forming a component of the underlying interface controlling interactions in underlying interfaces to adjust the carrier density in the adjacent metal oxide and a treated surface of the metal oxide film performed prior to deposition of material on the metal oxide layer controlling interactions in overlying interfaces to adjust the carrier density in the adjacent metal oxide.

19. A metal oxide semiconductor device on a substrate as claimed in claim 18 wherein the substrate is formed of flexible material.

20. A metal oxide semiconductor device on a substrate as claimed in claim 18 wherein the metal oxide active layer includes one of zinc oxide (ZnO), indium zinc oxide (IZnO), and indium zinc gallium oxide (IZnGaO) and the material in abutting engagement includes one of an inert material from one of $Al_2O_3$, $SiO_2$, SiN, TaO, $MgF_2$, polyimide, BCB, and photoresist and an active material from one of Al, Zn, Ti, Ta, ITO, Li, and Mg.

21. A metal oxide semiconductor device on a substrate as claimed in claim 18 wherein the metal oxide active layer is less than 50 nm thick.

* * * * *